United States Patent [19]

Kelley

[11] Patent Number: 4,604,584
[45] Date of Patent: Aug. 5, 1986

[54] SWITCHED CAPACITOR PRECISION DIFFERENCE AMPLIFIER

[75] Inventor: Stephen H. Kelley, Austin, Tex.

[73] Assignee: Motorola, Inc., Schaumburg, Ill.

[21] Appl. No.: 743,228

[22] Filed: Jun. 10, 1985

[51] Int. Cl.[4] .............................................. H03F 3/45
[52] U.S. Cl. ....................................... 330/9; 307/353;
307/356; 330/69; 330/107; 330/252
[58] Field of Search ...................... 330/9, 51, 69, 107,
330/252; 307/353, 355, 356; 328/151; 333/173

[56] References Cited
U.S. PATENT DOCUMENTS
4,028,558  6/1977  Heller et al. ........................ 307/355

Primary Examiner—James B. Mullins
Attorney, Agent, or Firm—Anthony J. Sarli, Jr.; Jeffrey Van Myers; Robert L. King

[57] ABSTRACT

A circuit which can selectively sample and hold two real time input voltages and provide an output voltage indicating the difference value of the input voltages is provided. A switched capacitor structure which provides no parasitic capacitance output error component when the two input voltages are substantially equal is used.

10 Claims, 5 Drawing Figures

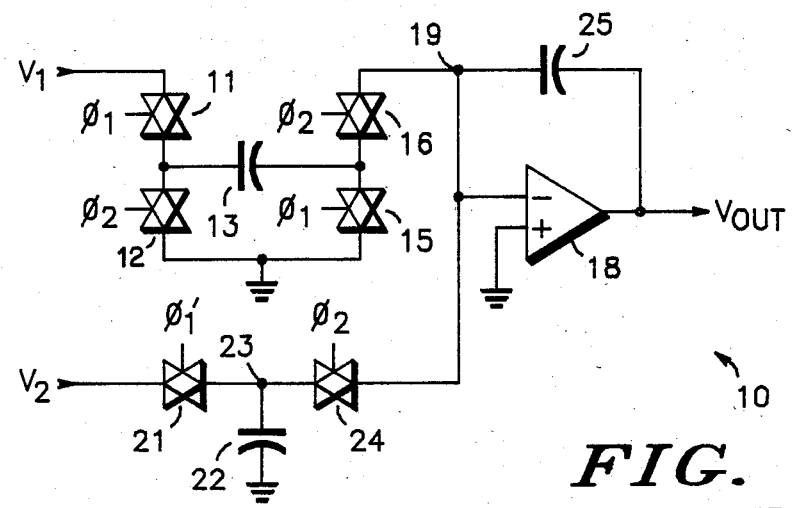
FIG. 1
—PRIOR ART—
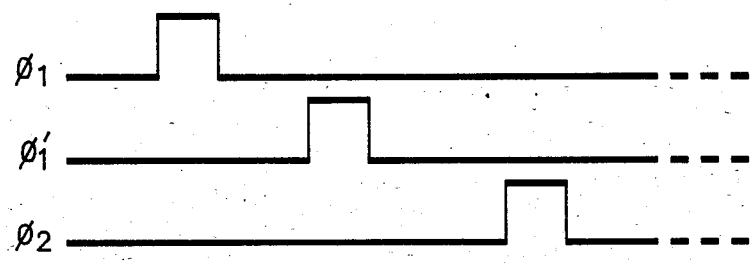
FIG. 2
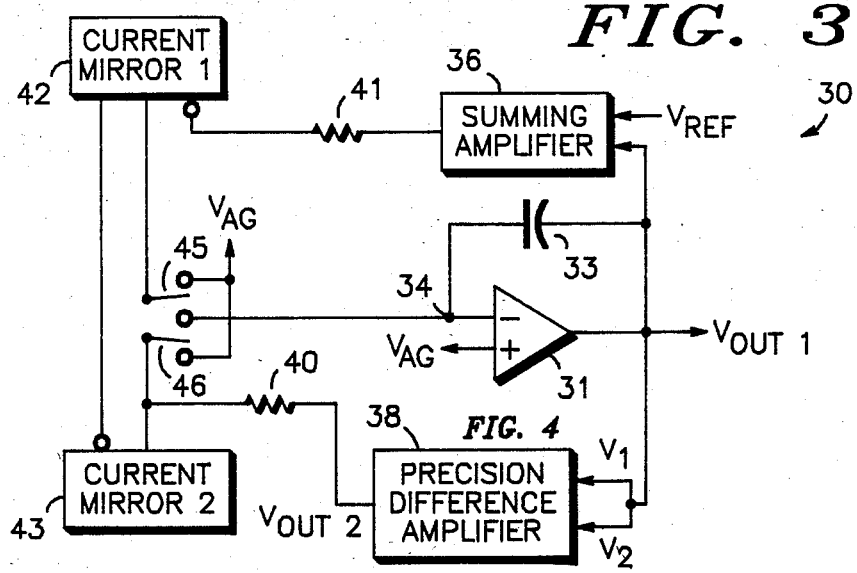
FIG. 3
FIG. 4

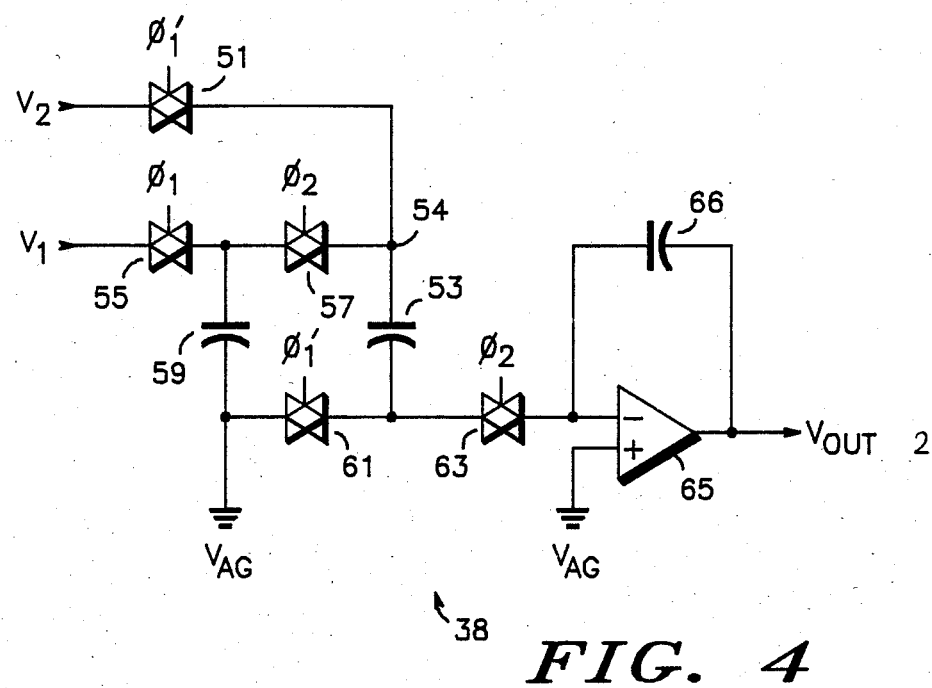
FIG. 4
FIG. 5
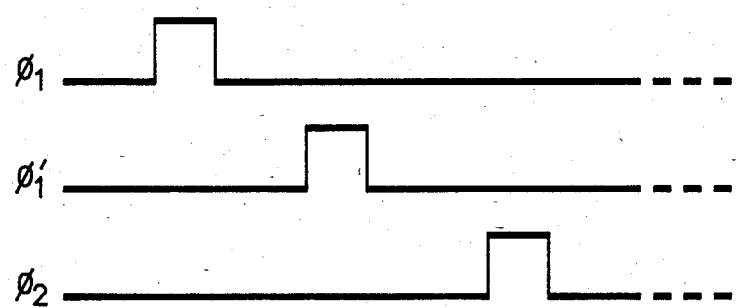

_4,604,584_

SWITCHED CAPACITOR PRECISION DIFFERENCE AMPLIFIER

TECHNICAL FIELD

This invention relates generally to amplifiers, and more particularly, to switched capacitor amplifiers.

BACKGROUND ART

Waveform generators typically require control circuitry to regulate specific points of a predetermined waveform with respect to time. For example, the peak value of a triangular waveform provided by a triangle waveform generator may vary significantly with respect to time. A typical triangle waveform generator provides a triangular output signal by integrating switched input current sources of opposite polarity. Waveform errors from such circuits commonly result from wide variations in the accuracy of the current sources which are used. To correct the variation in output waveforms, others have used precision difference amplifiers to precisely measure the value of a predetermined point of the waveform at differing points in time. If the difference in waveform values is not zero, the waveform is corrected so that the difference value at two different points in time becomes zero. Others have implemented precision difference amplifiers with switched capacitor structures which can sample and hold a waveform at two different points in time. However, known switched capacitor precision difference amplifiers have the disadvantage of having parasitic errors which adversely affect the accuracy of the amplifier.

BRIEF DESCRIPTION OF THE INVENTION

Accordingly, an object of the present invention is to provide an improved precision difference amplifier. Another object of the present invention is to provide an improved difference amplifier which can sample and hold two voltages at different time periods and provide a precise difference output.

Yet another object of the present invention is to provide an improved switched capacitor precision difference amplifier.

In carrying out the above and other objects of the present invention, there is provided, in one form, first and second charge storage devices, for selectively storing first and second input voltages, respectively. The second charge storage device is connected to a reference voltage terminal. A first switch couples the first charge storage device between the first input voltage and the reference voltage terminal during a first time period. A second switch couples the second input voltage to the second charge storage device during a second time period successive to the first time period. An integrating operational amplifier means is provided with a first input connected to the reference voltage terminal, a second input and an output for providing a difference signal proportional to the difference between the first and second input voltages. A third switch connects the first and second charge storage device in series between the reference voltage terminal and the second input of the operational amplifier during a third time period successive to the second time period.

These and other objects, features and advantages will be more clearly understood from the following detailed description taken in conjunction with the accompanying drawings.

BRIEF DESCRIPTION OF THE DRAWINGS

FIG. 1 illustrates in partial schematic form a switched capacitor difference amplifier circuit known in the art;

FIG. 2 illustrates in graphical form control signals associated with the circuit of FIG. 1;

FIG. 3 illustrates in block diagram form a triangle waveform generator utilizing the present invention;

FIG. 4 illustrates in partial schematic form a switched capacitor difference amplifier in accordance with the present invention; and FIG. 5 illustrates in graphical form signals associated with the circuit illustrated in FIG. 1.

DETAILED DESCRIPTION OF THE INVENTION

Shown in FIG. 1 is a switched capacitor difference amplifier 10 known in the art. A first input voltage $V_1$ is coupled to a first terminal of a switch 11. A control signal labeled $\phi_1$ is coupled to a control electrode of switch 11. A second terminal of switch 11 is connected to a first terminal of a switch 12 and to a first electrode of a capacitor 13. A control signal labeled $\phi_2$ is coupled to a control electrode of switch 12. A second terminal of switch 12 is connected to an analog ground $V_{AG}$. A second electrode of capacitor 13 is connected to a first terminal of both a switch 15 and a switch 16. A second terminal of switch 15 is connected to analog ground $V_{AG}$, and a second terminal of switch 16 is connected to a negative input of an operational amplifier 18 at a node 19. A positive input of operational amplifier 18 is connected to analog ground $V_{AG}$. A second input voltage $V_2$ is coupled to a first terminal of a switch 21. A second terminal of switch 21 is connected to a first electrode of a capacitor 22 at a node 23 and to a first terminal of a switch 24. A second electrode of capacitor 22 is connected to analog ground $V_{AG}$. A second terminal of switch 24 is connected to the negative input of operational amplifier at node 19. A capacitor 25 has a first electrode connected to the inverting input of operational amplifier 18 at node 19 and a second electrode connected to an output of operational amplifier 18 for providing an output voltage $V_{OUT}$. Although all switches are illustrated as CMOS transmission gates, any type of switch may be utilized to implement switches 11, 12, 15, 16, 21 and 22. All the illustrated switches become conductive when an associated control signal is present at a high logic level.

Referring to FIG. 2, the operation of difference amplifier 10 may be readily understood. At some point in time when the value of $V_1$ is to be sampled, control signal $\phi_1$ is at a high logic level and the remaining control signals are at a low logic level. Therefore, capacitor 13 is charged to voltage $V_1$ relative to analog ground and operational amplifier 18 is disconnected from capacitor 13. Capacitor 22 is disconnected from both input voltage $V_2$ and operational amplifier 18. After capacitor 13 has charged to voltage $V_1$, signal $\phi_1$ transitions to a low logic level. A predetermined amount of time later, signal $\phi'_1$ transitions to a high logic level. During this time frame, capacitor 22 charges to the value of the input voltage $V_2$ while being disconnected from operational amplifier 18. Capacitor 13 remains disconnected from operational amplifier 18. After capacitor 22 has charged to voltage $V_2$, signal $\phi'_1$ transitions back to a low logic level. With both input voltages stored on a predetermined capacitor, signal $\phi_2$ transitions to a high logic level which couples the second electrode of capacitor 13 and the first electrode of capacitor 22 to the negative input of operational amplifier 18. The first electrode of capacitor 13 and the second electrode of capacitor 22 are both connected to analog ground potential. Operational amplifier 18 functions as a differential amplifier to provide an output voltage $V_{OUT}$ which indicates whether input voltages $V_1$ and $V_2$ are equal or which input voltage has the larger magnitude.

Although difference amplifier 10 is capable of sampling a varying input signal at two different points in time, difference amplifier 10 is inaccurate due to the fact that the switched capacitor structure of capacitor 22 and switches 21 and 24 is parasitic prone. The parasitic capacitance associated with switches 21 and 24 results from process diffusions utilized to fabricate switches 21 and 24. Due to the unsymmetrical structure of switches 21 and 24 and capacitor 22 with respect to operational amplifier 18, the effects of parasitic capacitance associated with switches 21 and 24 do not cancel. Therefore, a voltage error typically results at the output of operational amplifier 18. In particular, the voltage across the parasitic capacitance of switch 24 which is coupled to node 23 varies from $V_2$ to analog ground in the process of coupling charge to operational amplifier 18. An opposite and equal cancelling charge does not exist to cancel the error.

Shown in FIG. 3 is a triangle waveform generator 30 which illustrates one of many applications for a precision difference amplifier. An operational amplifier 31 has a negative input connected to a first electrode of a feedback capacitor 33 at a node 34. A positive input of operational amplifier 31 is connected to a reference voltage such as analog ground $V_{AG}$. An output of operational amplifier 31 provides an output voltage $V_{OUT1}$ and is connected to a second electrode of capacitor 33 and to both a first input of a summing amplifier 36 and a first input of a precision difference amplifier 38. A second input of summing amplifier 36 is coupled to a reference voltage $V_{REF}$. A second input of difference amplifier 38 is also connected to the output of operational amplifier 31. The first input of difference amplifier 38 selectively receives a voltage $V_1$ during a first time period, and the second input of difference amplifier 38 selectively receives a voltage $V_2$ during a second time period. An output of difference amplifier 38 provides an output voltage $V_{OUT2}$ and is connected to a first terminal of a resistor 40. An output of summing amplifier 36 is connected to a first terminal of a resistor 41. A second terminal of resistor 41 is connected to an input of a current mirror circuit 42. A first output of current mirror circuit 42 is connected to an input of a current mirror circuit 43. A second output of current mirror circuit 42 is connected to a switch 45. Switch 45 alternately couples the second output of current mirror circuit 42 between node 34 and reference voltage $V_{AG}$. An output of current mirror circuit 43 is connected to a second terminal of resistor 40 and to a switch 46. Switch 46 alternately couples the output of current mirror circuit 43 between node 34 and analog ground $V_{AG}$ and opposite to the switching action of switch 45.

In operation, triangle waveform generator 30 functions to provide a triangular output waveform by alternately switching positive and negative currents to node 34 via switches 45 and 46, respectively. Summing amplifier 36 operates to sum output signal $V_{OUT1}$ with reference voltage $V_{REEF}$ which are two signals with opposite sign. Triangle waveform generator 30 functions to make the output of summing amplifier 36 equal to zero. Resistor 41 functions as a current limiting resistor to limit current to the input of current mirror 42. Simultaneously, precision difference amplifier 38 functions to sample a predetermined point of the output waveform at differing points in time to maintain the same value of the waveform at the predetermined point with respect to time. In the illustrated form, difference amplifier 38 functions to maintain the difference between voltages $V_1$ and $V_2$, which are values of output voltage $V_{OUT1}$ at different points in time, at precisely zero. Difference amplifier 38 functions as a nulling amplifier to maintain the current thru resistor 40 at zero when voltages $V_1$ and $V_2$ are equal.

Shown in FIG. 4 in further detail is precision difference amplifier 38 in accordance with the present invention. An input voltage $V_2$ is coupled to a first terminal of a switch 51. A second terminal of switch 51 is connected to a first electrode of a capacitor 53 at a node 54. A control signal $\phi'_1$ is coupled to a control electrode of switch 51. Although all switches are illustrated as conventional CMOS transmission gate switches, it should be clear that any type of switch may be used to implement the present invention. An input voltage $V_1$ is coupled to a first terminal of a switch 55. A second terminal of switch 55 is connected to a first terminal of a switch 57 and to a first electrode of a capacitor 59. A second terminal of switch 57 is connected to the first electrode of capacitor 53 at node 54. A second electrode of capacitor 59 is connected to both an analog ground reference voltage, $V_{AG}$, and a first terminal of a switch 61. A second terminal of switch 61 is connected to both a second electrode of capacitor 53 and a first terminal of a switch 63. A second terminal of switch 63 is connected to both a negative input of an operational amplifier 65 and to a first electrode of a feedback capacitor 66. A second electrode of feedback capacitor 66 is connected to an output of operational amplifier 65 for providing an output voltage $V_{OUT}$. A control signal $\phi_1$ is coupled to a control electrode of switch 55. A control signal $\phi_2$ is coupled to a control electrode of both switches 57 and 63. Control signal $\phi'_1$ is also coupled to a control electrode of switch 61.

In operation, precision difference amplifier 38 selectively samples voltage $V_1$ onto capacitor 59 in response to control signal $\phi_1$ and selectively samples voltage $V_2$ onto capacitor 53 in response to control signal $\phi'_1$. When each voltage is charge sampled onto a respective capacitor, each of capacitors 59 and 53 has the second electrode thereof connected to reference voltage analog ground. During a valid output period, signal $\phi_2$ is at a high logic level which connects capacitors 53 and 59 in series between analog ground and the negative input of operational amplifier 65 which is at a virtual ground since the positive input thereof is at analog ground. Signals $\phi_1$ and $\phi'_1$ are both at a logic low level during the valid output period. This switching operation changes the types of ground potential at the second electrode of capacitor 53 from an actual ground to a virtual ground. Whenever capacitors 59 and 53 are connected in series by switch 57, the capacitors are effectively coupled in parallel since each capacitor has the second electrode thereof connected to the same effective ground potential. When capacitors 53 and 59 are storing different voltages and are coupled in parallel, a resulting charge share produces a current which is sensed by feedback capacitor 66 to provide an output voltage. It can readily be shown that the resulting voltage at node 54 after switch 57 connects node 54 to the first electrode of capacitor is equal to one-half the sum of voltages $V_1$ and $V_2$. The resulting sign and magnitude of the output voltage indicates which input voltage is larger in magnitude and what polarity the larger input voltage has. The output voltage is equal to the voltage change which occurs at node 54 in response to the switching action multiplied by the capacitive ratio of capacitor 53 and capacitor 66. Therefore, the output voltage is equal to one-half the product of the difference of voltages $V_1$ and $V_2$ and the ratio of the capacitive values of capacitor 53 to capacitor 66. This output voltage can be used by other circuitry to correct the difference between the two sampled input voltages and make the two voltages precisely equal. For example, in triangle waveform generator 30, when an output voltage is provided by difference amplifier 38 indicating that $V_1$ and $V_2$ are not equal, a current through resistor 40 is developed which changes the amount of current coupled to operational amplifier 31 thru switch 46 in a way so that voltages $V_1$ and $V_2$ are precisely equal.

In the illustrated form, precision difference amplifier 38 is substantially a parasitic insensitive structure when used for a voltage nulling application because no nodes to which parasitic capacitances are coupled change voltage potential between clock phases. The nodes forming the second electrodes of capacitors 59 and 53 which are connected together are parasitic insensitive when equal voltages are charged onto capacitors 59 and 53 because the second electrodes are simply coupled between different points of analog ground. Therefore, the diffusions of the switches associated with switches 61 and 63 do not change voltage potential. The two nodes which switch 57 connects are parasitic prone. However, due to the fact that capacitors 59 and 53 are charged to substantially the same voltage, none of the diffusions which are coupled to node 54 and the other node which switch 57 is connected to change voltage potential when $V_1$ and $V_2$ are substantially equal. Only a small nonlinear error results from the parasitic capacitance associated with node 54 if $V_1$ and $V_2$ are unequal. However, once the difference between the two input voltages becomes zero in an application such as triangle waveform generator 30 of FIG. 3, none of the nodes of difference amplifier 38 are parasitic prone.

By now it should be apparent that a precision difference amplifier which has the ability to selectively sample and hold two differing real time input voltages and to calculate the difference has been provided. Switched capacitor structures which do not adversely affect circuit accuracy due to parasitic capacitance have been used. The real time input voltages do not have to be coupled to the circuit simultaneously and this permits the precision difference amplifier to make selective comparisons for precisely calculating the difference between two input voltages.

While an embodiment has been disclosed using certain assumed parameters, it should be understood that certain obvious modifications to the circuit or the given parameters will become apparent to those skilled in the art, and the scope of the invention should be limited only by the scope of the claims appended hereto.

I claim:

1. A precision difference amplifier comprising:
   first and second charge storage means, for selectively storing first and second input voltages, respectively, said first charge storage means being connected to a reference voltage terminal;
   first switching means for coupling the to the first charge storage means during a first time period;
   second switching means for coupling the second charge storage means between the second input voltage and the reference voltage terminal during a second time period successive to the first time period;
   integrating operational amplifier means having a first input connected to the reference voltage terminal, a second input, an output for providing a difference signal proportional to a differential voltage between the first and second inputs, and feedback charge storage means coupled between the second input and the output thereof; and
   third switching means for connecting the first and second charge storage means in series between the reference voltage terminal and the second input of the operational amplifier means during a third time period successive to the second time period.

2. The precision difference amplifier of claim 1 wherein the first switching means further comprise:
   a first switch having a first terminal coupled to the first input voltage, and a second terminal connected to the first charge storage means.

3. The precision difference amplifier of claim 2 wherein the first switch is an MOS transmission gate which is controlled by a first control signal.

4. The precision difference amplifier of claim 2 wherein the second switching means further comprise:
   a second switch having a first terminal for receiving the second input voltage, and a second terminal connected to the second charge storage means, said second switch being an MOS transmission gate controlled by a second control signal; and
   a third switch having a first terminal connected to the second charge storage means and a second terminal connected to the reference voltage terminal, said third switch also being an MOS transmission gate controlled by the second control signal.

5. The precision difference amplifier of claim 4 wherein the third switching means further comprise:
   a fourth switch having a first terminal connected to both the second terminal of the first switch and the first charge storage means, and a second terminal connected to the second charge storage means; and
   a fifth switch having a first terminal connected to both the first terminal of the third switch and the second charge storage means, and a second terminal connected to the second input of the integrating operational amplifier means.

6. The precision difference amplifier of claim 5 wherein the fourth and fifth switches are MOS transmission gates controlled by a third control signal.

7. A method of precisely measuring a difference in voltage potential, if any, between first and second input voltages, comprising the steps of:
   coupling a first capacitor between the first input voltage and a reference voltage terminal to charge the first capacitor to substantially the first input voltage during a first time period;
   coupling a second capacitor between the second input voltage and the reference voltage terminal to charge the second capacitor to substantially the second input voltage during a second time period;
   coupling the first and second capacitors in series between the reference voltage terminal and a first input of an integrating operational amplifier during a third time period, a second input of the integrating operational amplifier being at a voltage potential substantially equal to the reference voltage terminal; and providing at an output of the integrating operational amplifier a difference voltage which precisely indicates the difference between the first and second input voltages.

8. A switched capacitor precision difference amplifier comprising:

a first analog switch having a first terminal for receiving a first input voltage, a second terminal, and a control input for receiving a first control signal;

a second analog switch having a first terminal for receiving a second input voltage, a second terminal, and a control input for receiving a second control signal;

a first capacitor having a first electrode connected to the second terminal of the second switch, and a second electrode connected to a reference voltage terminal;

a second capacitor having a first electrode connected to the second terminal of the first switch, and a second electrode;

a third analog switch having a first terminal connected to the first electrode of the first capacitor, a second terminal connected to a first electrode of the second capacitor, and a control input for receiving a third control signal;

a fourth analog switch having a first terminal connected to the reference voltage terminal, a second terminal connected to the second electrode of the second capacitor, and a control input for receiving the first control signal;

a fifth analog switch having a first terminal connected to the second electrode of the second capacitor, a second terminal, and a control input for receiving the third control signal;

an operational amplifier having a first input connected to the second terminal of the fifth switch, a second input connected to the reference voltage terminal, and an output for providing an output difference signal; and a feedback capacitor connected between the output and the first input of the operational amplifier.

9. The switched capacitor precision difference amplifier of claim 8 wherein the first and fourth analog switches are conductive during a first time period, the second switch is conductive during a second time period, and the third and fifth switches are conductive during a third time period, said first, second and third time periods being non-overlapping, substantially successive time periods.

10. The switched capacitor precision difference amplifier of claim 8 wherein the first, second, third, fourth and fifth analog switches are MOS transmission gates.

* * * * *

UNITED STATES PATENT AND TRADEMARK OFFICE
CERTIFICATE OF CORRECTION

PATENT NO. : 4,604,584
DATED : August 5, 1986
INVENTOR(S) : Stephen H. Kelley

It is certified that error appears in the above-identified patent and that said Letters Patent is hereby corrected as shown below:

In claim one, column 6, line 3, after the first occurrence of "the" insert --first input voltage--.

Signed and Sealed this

Sixteenth Day of December, 1986

Attest:

DONALD J. QUIGG

Attesting Officer

Commissioner of Patents and Trademarks